United States Patent
Reed et al.

(10) Patent No.: US 6,384,747 B1
(45) Date of Patent: May 7, 2002

(54) DATA ENCODING TO PROVIDE RUN-LENGTH CONTROL IN A DATA STORAGE SYSTEM

(75) Inventors: David E. Reed, Westminster; Jay N. Livingston, Superior; Marvin L. Vis, Longmont, all of CO (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/694,587

(22) Filed: Oct. 23, 2000

(51) Int. Cl.[7] .............................................. H03M 7/46
(52) U.S. Cl. ...................................................... 341/59
(58) Field of Search .............................. 341/61, 59, 52, 341/67, 102

(56) References Cited

U.S. PATENT DOCUMENTS

| | | | |
|---|---|---|---|
| 4,978,955 A | 12/1990 | Howell | |
| 4,993,029 A | 2/1991 | Galbraith et al. | |
| 5,570,307 A | 10/1996 | Takahashi | |
| 5,712,863 A | 1/1998 | Gray | |
| 5,745,522 A | 4/1998 | Heegard | |
| 5,784,010 A | * 7/1998 | Coker et al. | ................... 341/59 |
| 5,844,509 A | 12/1998 | Behrens et al. | |
| 5,931,968 A | 8/1999 | Gray | |
| 6,009,550 A | 12/1999 | Gosula et al. | |
| 6,032,284 A | 2/2000 | Bliss | |
| 6,052,815 A | 4/2000 | Zook | |
| 6,052,817 A | 4/2000 | Whaley | |

* cited by examiner

*Primary Examiner*—Brian Young

(57) ABSTRACT

Data storage system circuitry comprises randomizer circuitry and run-length control circuitry. The randomizer circuitry generates randomized user data. The run-length control circuitry grades the randomized user data to determine if the randomized user data requires run-length encoding. The run-length control circuitry applies the run-length encoding to the randomized user data if the randomized user data requires run-length encoding. The run-length control circuitry may encode decoding information and error correction information for the decoding information into the randomized user data. The run-length encoding may comprise de-randomization or RLL encoding. If de-randomization is used, RLL encoding may be eliminated altogether for the randomized user data.

24 Claims, 4 Drawing Sheets

DATA ENCODING TO PROVIDE RUN-LENGTH CONTROL IN A DATA STORAGE SYSTEM

BACKGROUND OF THE INVENTION

1. Field of the Invention

The invention is related to the field of data storage systems, and in particular, to the encoding of user data to control run-length and improve system performance.

2. Statement of the Problem

Data storage systems include disk drives and tape drives. These storage drives encode user data and then write the encoded user data to storage media. When the data is later requested, the drive reads the encoded user data from the storage media and recovers the user data through a reciprocal decoding technique. Encoding often entails the conversion of user data into a series of transitions that are written to a disk or tape. For example, a transition may represent a "one", and a lack of a transition may represent a "zero". Some common encoding techniques are Non-Return to Zero Inverted (NRZI) and Partial Response Four (PR4).

In some cases, the encoded user data includes a string of zeros that are represented by a flat signal with no transitions. This lack of transitions creates timing and gain problems when recovering the user data. To relieve this problem, Run Length Limit (RLL) algorithms are used during the encoding process to systematically replace strings of zeros with special codes that include some transitions. Although RLL encoding improves timing and gain performance, it also requires additional bandwidth to carry RLL overhead information. This RLL bandwidth usage lowers the storage capacity of the data storage system.

Randomization is an encoding process where the user data is altered based on a numerical pattern that repeats over time. A Linear Feedback Shift Register (LFSR) operating based on an initial seed value produces the repeating numerical pattern. Logic is used to XOR the user data with the repeating numerical pattern to generate randomized user data.

Randomization tends to reduce the length of zero runs, and thus, reduce the need for RLL encoding. Unfortunately, the use of randomization has not been effectively implemented to significantly reduce and possibly eliminate the need for RLL encoding. As a result, bandwidth remains committed to RLL overhead. This loss of bandwidth lowers the storage capacity of the data storage system.

SUMMARY OF THE SOLUTION

The invention solves the above problems with circuitry that grades the randomized user data to significantly reduce, or even eliminate, the need for RLL encoding. As a result, the circuitry reduces or eliminates the bandwidth required for RLL encoding. This bandwidth savings increases the storage capacity of the data storage system.

In some examples of the invention, data storage system circuitry comprises randomizer circuitry and run-length control circuitry. The randomizer circuitry generates randomized user data. The run-length control circuitry grades the randomized user data to determine if the randomized user data requires run-length encoding. The run-length control circuitry applies the run-length encoding to the randomized user data if the randomized user data requires run-length encoding. The run-length control circuitry may encode decoding information and error correction information for the decoding information into the randomized user data. The run-length encoding may comprise de-randomization or RLL encoding. If de-randomization is used, RLL encoding may not even be used for the randomized user data.

In some examples of the invention, the randomized user data represents a data sector comprised of blocks. The run-length control circuitry may individually grade the blocks of the randomized user data based on zero-run characteristics. The run-length control circuitry may apply the run-length encoding to a pre-set number of the blocks of the randomized user data having worst grades.

In some examples of the invention, the run-length control circuitry grades the randomized user data based on zero-run characteristics. The run-length control circuitry determines if the randomized user data requires the run-length encoding based on whether a grade for the randomized user data exceeds a maximum zero-run constraint. The randomized user data may represent a data sector comprised of blocks. The run-length control circuitry may individually grade the blocks of the randomized user data to determine if individual ones of the blocks of the randomized user data require the run-length encoding. If so, the run-length control circuitry may apply the run-length encoding to the individual ones of the blocks of the randomized user data.

DESCRIPTION OF THE DRAWINGS

The same reference number represents the same element on all drawings.

DETAILED DESCRIPTION OF THE INVENTION

Figure 1:
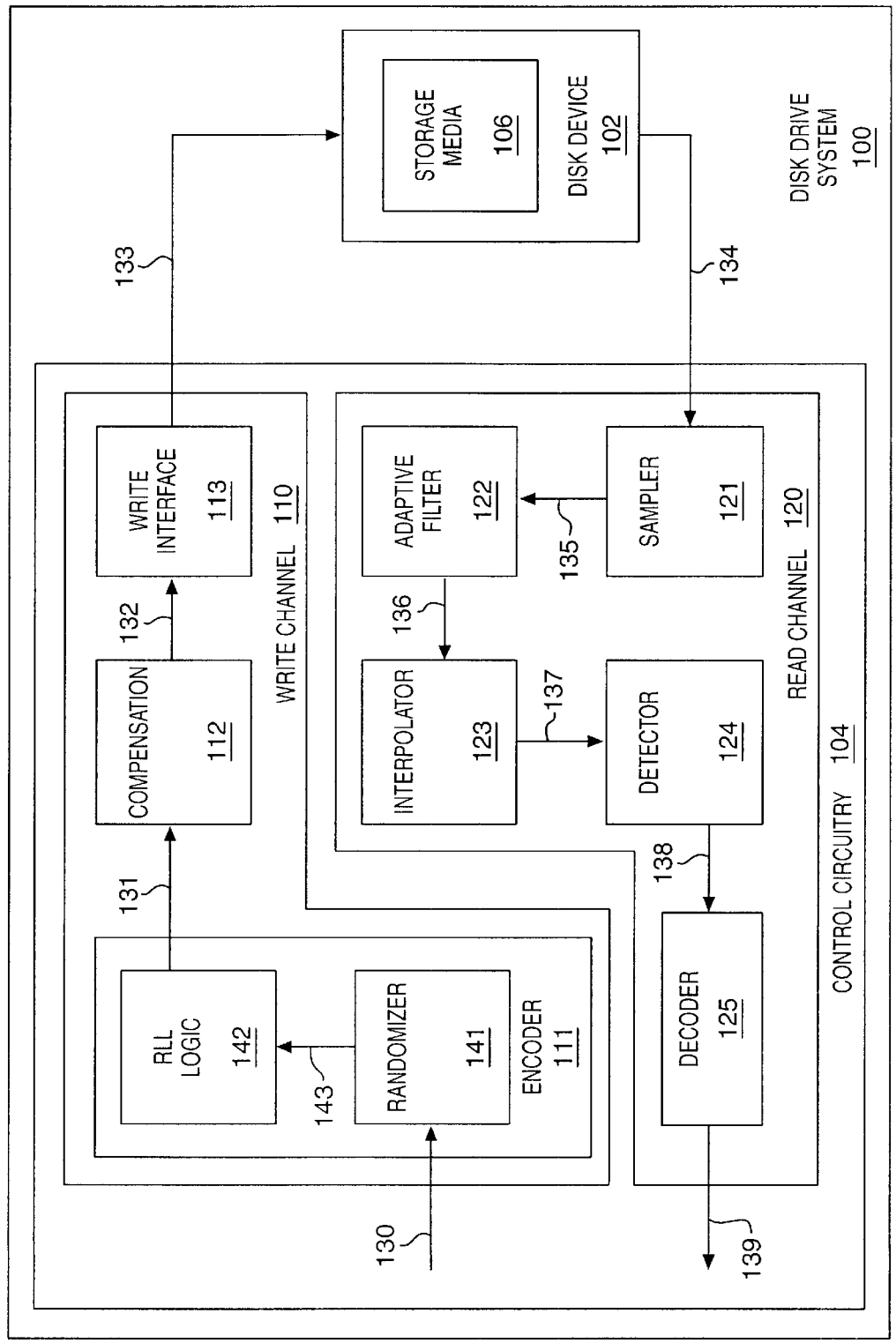
FIG. 1 is a block diagram that illustrates a disk drive system in the prior art.

Prior Art Disk Drive System—FIG. 1

FIG. 1 is a block diagram that illustrates disk drive system 100 in the prior art. Disk drive system 100 includes a disk device 102 and associated control circuitry 104. Disk device 102 includes storage media 106. Some examples of storage media 106 include magnetic disks and optical disks. Control circuitry 104 includes write channel 110 and read channel 120. Write channel 110 includes encoder 111, compensation 112, and write interface 113 connected in series. Encoder 111 comprises randomizer 141 and RLL logic 142. Read channel 120 includes sampler 121, adaptive filter 122, interpolator 123, detector 124, and decoder 125 connected in series. Interface 113 and sampler 121 are coupled to disk device 102.

Data signal 130 carries user data. Write channel 110 receives data signal 130 and transfers a corresponding write signal 133 to disk device 102. Disk device 102 stores the data on storage media 106. Typically, the user data is stored in data sectors that are comprised of data blocks. Subsequently, disk device 102 reads storage media 106 and transfers a corresponding read signal 134 to read channel 120. Write signal 133 and read signal 134 should both represent the data. Read channel 120 processes read signal 134 to generate data signal 139. Ideally, data signal 139 carries the same user data as data signal 130.

Write channel 110 operates as follows. Randomizer 141 in encoder 111 receives and randomizes data signal 130 to generate randomized signal 143. Randomizer 141 uses an LFSR to generate a repeating numerical pattern, and then, randomizer 141 XORs data signal 130 with the numerical pattern. RLL logic 142 systematically replaces zero runs in randomized data 143 to generate encoded data 131. Encoder 111 may add error-checking information to encoded data 131 for use during decoding. Encoder 111 transfers encoded signal 131 to compensation 112. Compensation 112 adjusts the timing of transitions in encoded signal 131 to generate time-adjusted signal 132. Compensation 112 transfers time-adjusted signal 132 to write interface 113. Interface 113 converts time-adjusted signal 132 from digital to analog to generate write signal 133. Interface 113 transfers write signal 133 to disk device 102.

If storage media 106 is a magnetic disk, then write signal 133 drives a magnetic head that alters a magnetic field to create magnetic transitions on the magnetic disk. These magnetic transitions should represent the data. The magnetic head subsequently detects the magnetic transitions to generate read signal 134. If storage media 106 is an optical disk, then write signal 133 drives a system that creates pits in the surface of the optical disk. The pits are physical transitions that represent the data. An optical head subsequently projects a laser onto the surface of the disk. The optical head detects the reflection of the laser, which is altered by the pits, to generate read signal 134.

The positioning of heads relative to storage media 106 is essential for proper system operation. Servo information is stored on storage media 106 to facilitate this positioning. Read signal 134 includes this servo information. The control circuitry 104 processes the servo information from read signal 134 to control the location of the heads relative to storage media 106.

Read channel 120 operates as follows. Sampler 121 receives and samples read signal 134 to generate read samples 135. Sampler 121 transfers read samples 135 to adaptive filter 122. Adaptive filter 122 removes distortion by shaping read samples 135 to generate equalized samples 136. Adaptive filter 122 transfers equalized samples 136 to interpolator 123. Interpolator 123 synchronizes equalized samples 136 with the clock for detector 124 to generate interpolated samples 137. Interpolator 123 transfers interpolated samples 137 to detector 124. Detector 124 uses a detection algorithm, such as the Viterbi algorithm, to convert interpolated samples 137 into an encoded signal 138 that represents the data. Detector 124 transfers encoded signal 138 to decoder 125. Decoder 125 performs error-checking functions on encoded signal 138. Decoder 125 applies a decoding technique, such as PR4 with a D constraint, to decode RLL encoding in encoded signal 138. Decoder 125 then de-randomizes the RLL-decoded signal to obtain data signal 139. Decoder 125 transfers data signal 139 to control circuitry 104.

Figure 2:
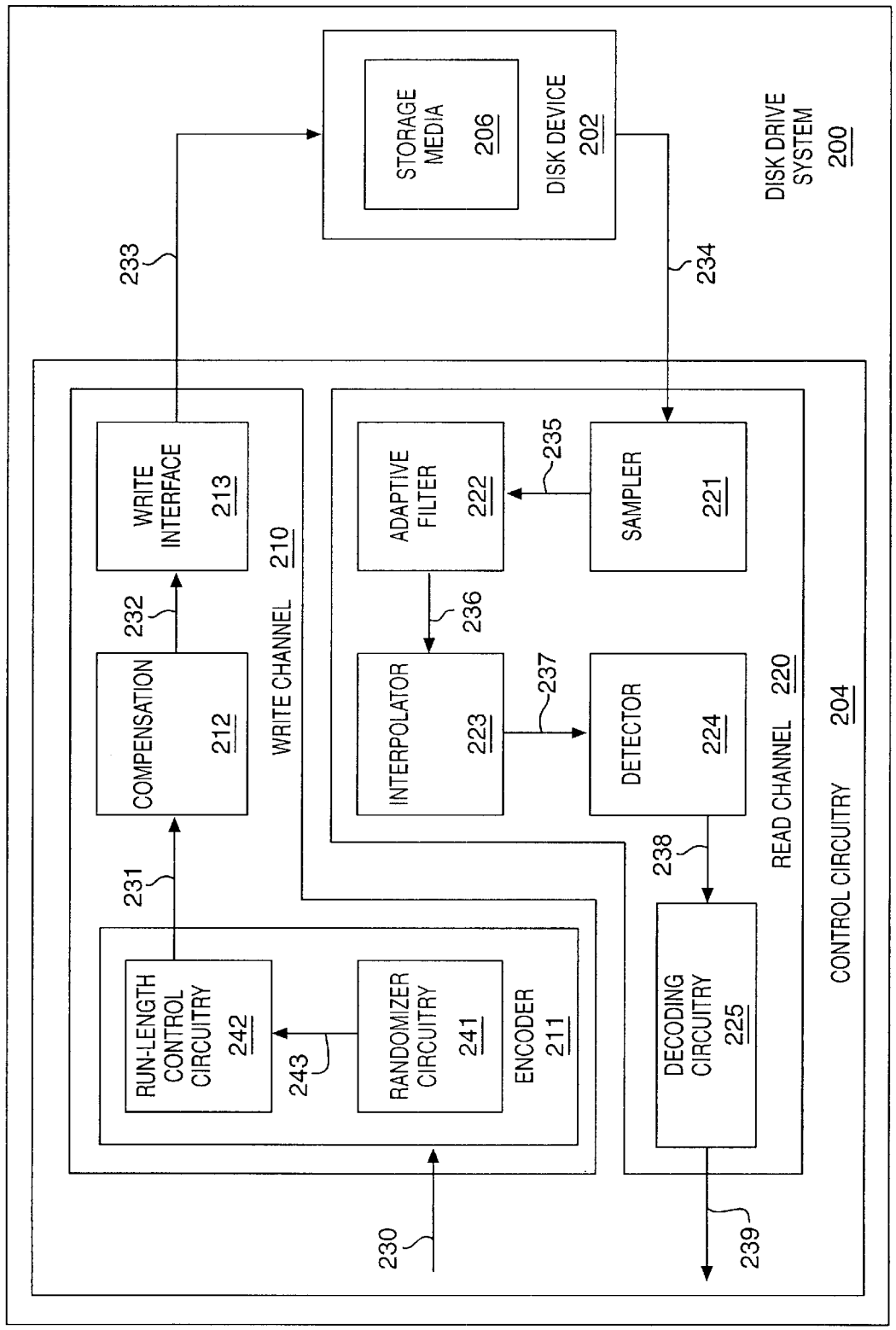
FIG. 2 is a block diagram that illustrates a disk drive system in an example of the invention.

Disk Drive System—FIG. 2

FIG. 2 depicts a specific example of a disk drive system in accord with the present invention. Those skilled in the art will appreciate how the principles illustrated below could be applied to other data storage systems, such as tape drives. Those skilled in the art will appreciate numerous variations from this example that do not depart from the scope of the invention. Those skilled in the art will also appreciate that various features could be combined to form multiple variations of the invention. Those skilled in the art will appreciate that some conventional aspects of FIG. 2 have been simplified or omitted for clarity.

FIG. 2 is a block diagram that illustrates disk drive system 200 in an example of the invention. Disk drive system 200 includes a disk device 202 and associated control circuitry 204. Disk device 202 includes storage media 206. Some examples of storage media 206 include magnetic disks and optical disks. Control circuitry 204 includes write channel 210 and read channel 220. Write channel 210 includes encoder 211, compensation 212, and write interface 213 connected in series. Encoder 211 comprises randomizer circuitry 241 and run-length control circuitry 242. Read channel 220 includes sampler 221, adaptive filter 222, interpolator 223, detector 224, and decoding circuitry 225 connected in series. Interface 213 and sampler 221 are coupled to disk device 202.

Data signal 230 carries user data. Write channel 210 receives data signal 230 and transfers a corresponding write signal 233 to disk device 202. Disk device 202 stores the data on storage media 206. Typically, the user data is stored in data sectors that are comprised of data blocks. Subsequently, disk device 202 reads storage media 206 and transfers a corresponding read signal 234 to read channel 220. Write signal 233 and read signal 234 should both represent the data. Read channel 220 processes read signal 234 to generate data signal 239. Ideally, data signal 239 carries the same user data as data signal 230.

Write channel 210 operates as follows. Randomizer circuitry 241 in encoder 211 receives data signal 230. Randomizer circuitry 241 generates randomized user data 243 from the user data in data signal 230. Randomizer circuitry 241 transfers randomized user data 243 to run-length control circuitry 242.

Run-length control circuitry 242 grades randomized user data 243 to determine if randomized user data 243 requires run-length encoding. If required, run-length control circuitry 242 applies run-length encoding to randomized user data 243. Thus, run-length control circuitry 242 evaluates the effects of randomization to selectively apply run-length encoding instead of the systematic approach in the prior art. This selective application of run-length encoding provides bandwidth savings that increase system capacity.

Run-length control circuitry 242 may encode decoding information and error correction information for the decoding information into randomized user data 243. The run-length encoding may comprise de-randomization or RLL encoding. If de-randomization is used to provide run-length control, RLL encoding may be eliminated altogether for randomized user data 243. Advantageously, the reduction or elimination of RLL encoding increases the capacity of disk drive system 200 over prior art disk drive system 100.

Encoder 211 uses the resulting signal from run-length control 242 to form encoded signal 231. Encoder 211 may add error-checking information for use during decoding. Encoder 211 transfers encoded signal 231 to compensation 212. Compensation 212 adjusts the timing of transitions in encoded signal 231 to generate time-adjusted signal 232. Compensation 212 transfers time-adjusted signal 232 to write interface 213. Interface 213 converts time-adjusted signal 232 from digital to analog to generate write signal 233. Interface 213 transfers write signal 233 to disk device 202.

If storage media 206 is a magnetic disk, then write signal 233 drives a magnetic head that alters a magnetic field to create magnetic transitions on the magnetic disk. These magnetic transitions should represent the data. The magnetic head subsequently detects the magnetic transitions to generate read signal 234. If storage media 206 is an optical disk, then write signal 233 drives a system that creates pits in the surface of the optical disk. The pits are physical transitions that represent the data. An optical head subsequently projects a laser onto the surface of the disk. The optical head detects the reflection of the laser, which is altered by the pits, to generate read signal 234.

The positioning of heads relative to storage media 206 is essential for proper system operation. Servo information is stored on storage media 206 to facilitate this positioning. Read signal 234 includes this servo information. The control circuitry 204 processes the servo information from read signal 234 to control the location of the heads relative to storage media 206.

Read channel 220 operates as follows. Sampler 221 receives and samples read signal 234 to generate read samples 235. Sampler 221 transfers read samples 235 to adaptive filter 222. Adaptive filter 222 removes distortion by shaping read samples 235 to generate equalized samples 236. Adaptive filter 222 transfers equalized samples 236 to interpolator 223. Interpolator 223 synchronizes equalized samples 236 with the clock for detector 224 to generate interpolated samples 237. Interpolator 223 transfers interpolated samples 237 to detector 224. Detector 224 uses a detection algorithm, such as a Viterbi state machine, to convert interpolated samples 237 into an encoded signal 238 that represents the data. Detector 224 transfers encoded signal 238 to decoding circuitry 225.

Decoding circuitry 225 performs error-checking functions, decodes any RLL encoding, and de-randomizes encoded signal 238. To perform decoding, decoding circuitry 225 uses the decoding and error correction information that was added by run-length control circuitry 242. Some portions of encoded signal 238 may not require de-randomization or RLL de-coding as a result of run-length control circuitry 242. Decoding circuitry 225 may apply a decoding technique, such as PR4 with a D=0 constraint. Decoding circuitry 225 transfers resulting data signal 239 to control circuitry 204.

Figure 3:
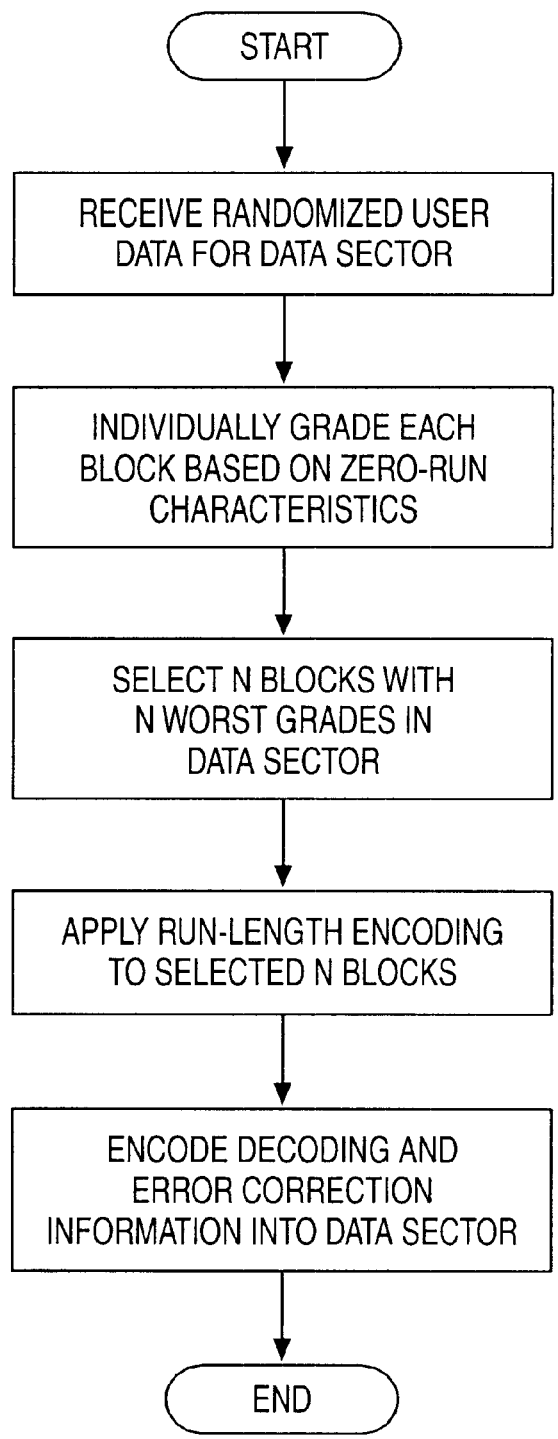
FIG. 3 is a flow diagram that illustrates run-length control circuitry operation in an example of the invention.
Figure 4:
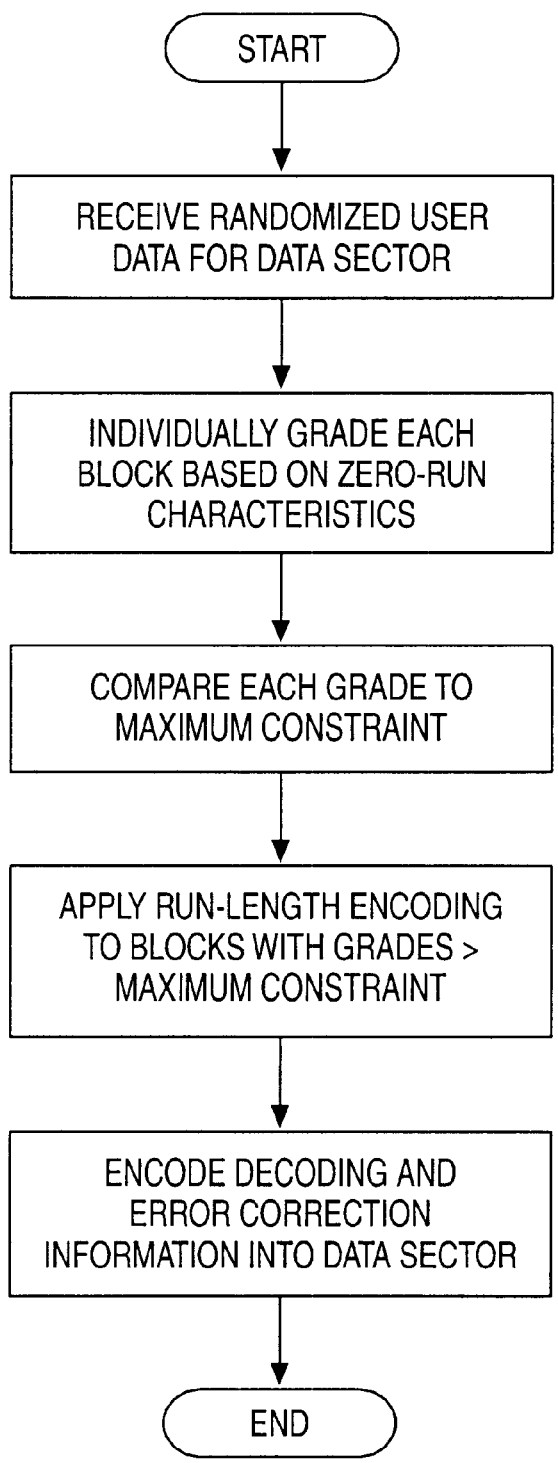
FIG. 4 is a flow diagram that illustrates run-length control circuitry operation in an example of the invention.

Run-Length Control Circuitry—FIGS. 3–4

FIGS. 3–4 depicts a specific example of run-length control circuitry in accord with the present invention. The run-length control circuitry could be used with data storage systems, such as disk drives or tape drives. Those skilled in the art will appreciate numerous variations from this example that do not depart from the scope of the invention. Those skilled in the art will also appreciate that various features could be combined to form multiple variations of the invention. Those skilled in the art will appreciate that some conventional aspects of FIGS. 3–4 have been simplified or omitted for clarity.

FIG. 3 is a flow diagram that illustrates the operation of run-length control circuitry in an example of the invention. Prior to operation, the run-length control circuitry is configured with a pre-set number N that indicates the number of blocks per data sector that will receive run-length encoding. Advantageously, the pre-set number N maintains a fixed length for each encoded data block because the amount of run-length encoding does not vary.

The run-length control circuitry receives randomized user data for a data sector. The run-length control circuitry individually grades each block in the data sector based on zero-run characteristics. The run-length control circuitry selects the N blocks with the N worst grades in the data sector. The run-length control circuitry then applies run-length encoding to the selected N blocks and encodes decoding and error correction information into the data sector. The decoding information indicates which blocks are run-length encoded and the keys for decoding these blocks. The error correction information is for the decoding information. The decoding circuitry uses the error correction information to recover the decoding information. The decoding circuitry then uses the decoding information to identify and decode the appropriate blocks.

The run-length encoding may be RLL encoding or de-randomization. Randomization alters the user data based on a numerical pattern. If the randomized user data in a block includes a long zero run, then the original user data prior to randomization should not have included the long zero run if the numerical pattern is properly controlled. The numerical pattern must be controlled to avoid long zero runs in both the original user data and its randomized version. For example, a linear feedback shift register has a maximum run-length which is limited by the register size. Those skilled in the art will appreciate how to exert such control over the numerical pattern. If the randomized user data in a block includes a long zero run, then de-randomization recovers the original user data without the long zero run.

FIG. 4 is a flow diagram that illustrates the operation of run-length control circuitry in an alternative example of the invention. Prior to operation, the run-length control circuitry is configured with a maximum constraint, such as a maximum allowed zero run. The run-length control circuitry receives randomized user data for a data sector. The run-length control circuitry individually grades each block in the data sector based on zero-run characteristics. The run-length control circuitry compares each grade to the maximum constraint, and if a grade exceeds the maximum constraint, then the run length control circuitry applies run length encoding to the corresponding block. The run-length encoding may be RLL encoding or de-randomization. The run-length circuitry encodes decoding and error correction information into the data sector.

The above-described run-length control circuitry may include a processor and may also include storage media that stores instructions that are retrieved and executed by the processor. Some examples of instructions are software and firmware. Some examples of storage media are memory devices, tape, disks, integrated circuits, and servers. The instructions are operational when executed by the processor to direct the processor to operate in accord with the invention. The term "processor" refers to a single processing device or a group of inter-operational processing devices. Some examples of processors are computers, integrated circuits, and logic circuitry. Those skilled in the art are familiar with instructions, processors, and storage media.

Those skilled in the art will appreciate variations of the above-described embodiments that fall within the scope of the invention. As a result, the invention is not limited to the specific examples and illustrations discussed above, but only by the following claims and their equivalents.

What is claimed is:

1. Data storage system circuitry comprising:
   randomizer circuitry configured to generate randomized user data; and
   run-length control circuitry configured to grade the randomized user data to determine if the randomized user data requires run-length encoding and to apply the run-length encoding to the randomized user data if the randomized user data requires run-length encoding.

2. The data storage system circuitry of claim 1 wherein the randomized user data represents a data sector comprised of blocks and wherein the run-length control circuitry is configured to individually grade the blocks of the randomized user data and to apply the run-length encoding to a pre-set number of the blocks of the randomized user data having worst grades.

3. The data storage system circuitry of claim 2 wherein the run-length control circuitry is configured to individually grade the blocks of the randomized user data based on zero-run characteristics.

4. The data storage system circuitry of claim 3 wherein the run-length encoding comprises de-randomization.

5. The data storage system circuitry of claim 4 wherein Run Length Limit (RLL) encoding is not used for the randomized user data.

6. The data storage system circuitry of claim 3 wherein the run-length encoding comprises Run Length Limit (RLL) encoding.

7. The data storage system circuitry of claim 1 wherein the run-length control circuitry is configured to grade the randomized user data based on zero-run characteristics and to determine if the randomized user data requires the run-length encoding based on whether a grade for the randomized user data exceeds a maximum constraint.

8. The data storage system circuitry of claim 7 wherein the run-length encoding comprises de-randomization.

9. The data storage system circuitry of claim 8 wherein Run Length Limit (RLL) encoding is not used for the randomized user data.

10. The data storage system circuitry of claim 9 wherein the run-length encoding comprises Run Length Limit (RLL) encoding.

11. The data storage system circuitry of claim 7 wherein the randomized user data represents a data sector comprised of blocks and wherein the run-length control circuitry is configured to individually grade the blocks of the randomized user data to determine if individual ones of the blocks of the randomized user data require the run-length encoding, and if so, to apply the run-length encoding to the individual ones of the blocks of the randomized user data.

12. The data storage system circuitry of claim 1 wherein the run-length control circuitry is configured to encode decoding information and error correction information for the decoding information into the randomized user data.

13. A method of operating data storage system circuitry, the method comprising:

generating randomized user data;

grading the randomized user data to determine if the randomized user data requires run-length encoding; and applying the run-length encoding to the randomized user data if the randomized user data requires the run-length encoding.

14. The method of claim 13 wherein the randomized user data represents a data sector comprised of blocks and wherein:

grading the randomized user data comprises individually grading the blocks of the randomized user data; and applying the run-length encoding to the randomized user data if the randomized user data requires the run-length encoding comprises applying the run-length encoding to a pre-set number of the blocks of the randomized user data having worst grades.

15. The method of claim 14 wherein individually grading the blocks of the randomized user data comprises individually grading the blocks of the randomized user data based on zero-run characteristics.

16. The method of claim 15 wherein applying the run-length encoding comprises applying de-randomization.

17. The method of claim 16 wherein Run Length Limit (RLL) encoding is not used for the randomized user data.

18. The method of claim 15 wherein applying the run-length encoding comprises applying Run Length Limit (RLL) encoding.

19. The method of claim 13 wherein grading the randomized user data to determine if the randomized user data requires the run-length encoding comprises:

grading the randomized user data based on zero-run characteristics: and determining if the randomized user data requires the run-length encoding based on whether a grade for the randomized user data exceeds a maximum constraint.

20. The method of claim 19 wherein the run-length encoding comprises de-randomization.

21. The method of claim 20 wherein Run Length Limit (RLL) encoding is not used for the randomized user data.

22. The method of claim 21 wherein the run-length encoding comprises Run Length Limit (RLL) encoding.

23. The method of claim 19 wherein the randomized user data represents a data sector comprised of blocks and wherein:

grading the randomized user data to determine if the randomized user data requires the run-length encoding comprises individually grading the blocks of the randomized user data to determine if individual ones of the blocks of the randomized user data require the run-length encoding; and applying the run-length encoding to the randomized user data if the randomized user data requires run-length encoding comprises applying the run-length encoding to the individual ones of the blocks of the randomized user data.

24. The method of claim 13 further comprising encoding decoding information and error correction information for the decoding information into the randomized user data.

* * * * *